US007812650B2

(12) United States Patent
Song et al.

(10) Patent No.: US 7,812,650 B2
(45) Date of Patent: Oct. 12, 2010

(54) BIAS VOLTAGE GENERATION CIRCUIT AND CLOCK SYNCHRONIZING CIRCUIT

(75) Inventors: Taek-Sang Song, Kyoungki-do (KR);
Kyung-Hoon Kim, Kyoungki-do (KR);
Dae-Han Kwon, Kyoungki-do (KR);
Dae-Kun Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 61 days.

(21) Appl. No.: 12/157,235

(22) Filed: Jun. 9, 2008

(65) Prior Publication Data

US 2009/0160510 A1    Jun. 25, 2009

(30) Foreign Application Priority Data

Dec. 21, 2007    (KR)    ................ 10-2007-0135145

(51) Int. Cl.
*H03L 7/06* (2006.01)

(52) U.S. Cl. .................... 327/156; 327/147

(58) Field of Classification Search ............ 327/148, 327/157
See application file for complete search history.

(56) References Cited

U.S. PATENT DOCUMENTS

| 5,233,314 | A | * | 8/1993 | McDermott et al. | ........... 331/17 |
| 5,440,272 | A | * | 8/1995 | Orisaka et al. | ............. 330/253 |
| 5,812,022 | A | * | 9/1998 | Hirano et al. | ............. 327/563 |
| 6,556,088 | B1 | * | 4/2003 | Dietl et al. | .................... 331/17 |
| 6,624,674 | B1 | * | 9/2003 | Zhao | .......................... 327/156 |
| 6,693,496 | B1 | | 2/2004 | Lebouleux | |
| 6,724,230 | B2 | * | 4/2004 | Hirabayashi | ................ 327/280 |
| 6,753,740 | B2 | * | 6/2004 | Gauthier et al. | ............. 331/185 |
| 6,873,214 | B2 | * | 3/2005 | Harwood | ...................... 331/17 |
| 6,885,253 | B2 | * | 4/2005 | Ahmed | ......................... 331/45 |
| 6,922,047 | B2 | | 7/2005 | Knoll et al. | |
| 7,095,289 | B2 | | 8/2006 | Knoll et al. | |
| 7,113,014 | B1 | * | 9/2006 | Doyle | .......................... 327/172 |
| 7,173,461 | B2 | * | 2/2007 | Tan et al. | .................... 327/157 |
| 7,310,020 | B2 | * | 12/2007 | Tan et al. | ....................... 331/16 |
| 2004/0183576 | A1 | * | 9/2004 | Kiyose et al. | ............... 327/157 |
| 2008/0036551 | A1 | * | 2/2008 | Kim | ........................... 331/183 |
| 2009/0160560 | A1 | * | 6/2009 | Song et al. | .................... 331/17 |

FOREIGN PATENT DOCUMENTS

| JP | 06-276092 A | 2/1994 |
| JP | 06-276092 | 9/1994 |
| JP | 2001-339301 | 12/2001 |
| KR | 10-2002-0088545 | 11/2002 |

* cited by examiner

*Primary Examiner*—Lincoln Donovan
*Assistant Examiner*—Thomas J Hiltunen
(74) *Attorney, Agent, or Firm*—Blakely, Sokoloff, Taylor & Zafman

(57) ABSTRACT

Bias voltage generator circuit and clock synchronizing circuit includes a bias unit configured to control a current in response to a bandwidth control signal, an amplification unit configured to differentially amplify an input signal in response to the current controlled by the bias unit and an output unit configured to receive an output signal of the amplification unit to output the bias voltage.

12 Claims, 4 Drawing Sheets

BIAS VOLTAGE GENERATION CIRCUIT AND CLOCK SYNCHRONIZING CIRCUIT

CROSS-REFERENCE TO RELATED APPLICATIONS

The present invention claims priority of Korean patent application number 10-2007-0135145, filed on Dec. 21, 2007, which is incorporated by reference in its entirety.

BACKGROUND OF THE INVENTION

The present invention relates to a synchronizing circuit and a bias voltage generation circuit for the phase locked loop.

A phase locked loop (PLL) and a delay locked loop (DLL) are representative examples of a feedback system. In a synchronous semiconductor memory device, the feedback system transfers data to/from external devices with the help of an internal clock signal that is locked in synchronization with an external clock signal input from an external device such as a memory controller. Therefore, the synchronization of the data transfer with the reference clock signal is very important for a stable data transfer between the semiconductor memory device and the memory controller.

A typical PLL feedback system includes a phase frequency detector, a charge pump, a loop filter and a voltage-controlled oscillator, to change a frequency according to a clock signal input to a PLL system. The phase frequency detector detects a phase difference between an input clock and a return clock to generate an up signal UP or a down signal DN according to the phase difference. The charge pump outputs current proportional to the up and down signals. The loop filter smoothes the current to output a voltage. The voltage-controlled oscillator receives the voltage to output a frequency.

The feedback system is used in a variety of digital circuits such as a semiconductor memory device. The feedback system is composed of an NMOS transistor and a PMOS transistor owing to restrictions of capacity, volume, and the like. Therefore, the feedback system requires an NMOS control voltage (hereinafter, referred to as "N-bias voltage") for the NMOS transistor, and a PMOS control voltage (hereinafter, referred to as "P-bias voltage") for the PMOS transistor.

Accordingly, nowadays, the PLL system includes a bias voltage generation circuit generating a control voltage for a MOS transistor.

FIG. 1 is a circuit diagram of a bias voltage generation circuit for generating a bias voltage of an NMOS transistor used in a conventional PLL system.

Referring to FIG. 1, the conventional bias voltage generation circuit includes a bias unit 10, an operational (OP) amplification unit 20, and an N-bias voltage output unit 30. The bias unit 10 receives a bias control voltage to generate a DC current of the OP amplification unit. The OP amplification unit 20 differential-amplifies a control voltage VCTRL received from a charge pump (not shown). The N-bias voltage output unit 30 includes a capacitor CLOAD for adjusting phase margins of the OP amplification unit 20 and a replica cell of a voltage-controlled oscillator (VCO).

The bias unit 10 includes a PMOS transistor MP1 and two NMOS transistors MN1 and MN2 connected in series between a supply voltage VDD and a ground voltage. The PMOS transistor MP1 has a source connected to the supply voltage VDD, and a drain and a gate connected to a common node. The NMOS transistor MN2 has a drain connected to the drain of the PMOS transistor MP1, a gate configured to receive an enable signal, and a source connected to a drain of the NMOS transistor MN1. The NMOS transistor MN1 has the drain connected to the source of the NMOS transistor MN2, a gate configured to receive a bias control voltage VEXT, and a source connected to the ground voltage.

The OP amplification unit 20 differentially amplifies a control voltage VCTRL in response to a DC current received from the bias unit 10. The OP amplification unit 20 includes a PMOS transistor MP2. The PMOS transistor MP2 has a source connected to a supply voltage, a gate connected to the gate of the PMOS transistor MP1, and a drain connected to PMOS transistors MP3 and MP4.

The PMOS transistor MP3 has a source connected to the drain of the PMOS transistor MP2, a gate configured to receive a control voltage VCTRL generated by a charge pump (not shown), and a drain connected to a drain of the NMOS transistor MN3. The NMOS transistor MN3 has the drain connected to the drain of the PMOS transistor MP3, and a source connected to a ground voltage. The PMOS transistor MP4 has a source connected to the drain of the PMOS transistor MP2, a gate connected to the output unit 30, and a drain connected to a drain of an NMOS transistor MN4. The NMOS transistor MN4 has a source connected to a ground voltage, and a drain and a gate connected to each other. Gates of the NMOS transistors MN3 and MN4 are interconnected. A node connecting the PMOS transistor MP3 and the NMOS transistor MN3 is connected to an N-bias output terminal of the output unit 30.

The output unit 30 includes a capacitor CLOAD for adjusting phase margins of the OP amplification unit 20 and a VCO replica cell (not shown). The capacitor CLOAD is connected to the output terminal outputting a voltage differentially amplified by the OP amplification unit 20. The output unit 30 also includes a circuit for controlling a feedback signal according to an output of the OP amplification unit 20.

In other words, the output unit 30 includes PMOS transistors MP5 and MP6. The PMOS transistor MP5 has a gate configured to receive the control voltage VCTRL from the charge pump (not shown), and a source connected to the supply voltage. The PMOS transistor MP5 also has a drain connected to a common node connecting a gate and a drain of the PMOS transistor MP6. A source of the PMOS transistor MP6 is connected to a supply voltage. The common node is connected to the gate of the PMOS transistor MP4 in the OP amplification unit 20 to form a feedback path from the output unit 30 to the OP amplification unit 20.

Three NMOS transistors MN5, MN6 and MN7 are connected between the common node and a ground voltage. A gate of the NMOS transistor MN5 is connected to a supply voltage, a gate of the NMOS transistor MN6 is configured to receive an enable signal, and a gate of the NMOS transistor MN7 is configured to receive an output of the OP amplification unit 20.

A method for generating an N-bias voltage by the conventional bias voltage generation circuit having the above-described configuration will be described below.

Referring to FIG. 1, an MRS (not shown) applies the enable signal to the gate of the NMOS transistor MN2 in the bias unit 10 and to the gate of the NMOS transistor MN6 in the output unit 30, to enable the bias voltage generation circuit. Then, the bias control voltage VEXT is input to the gate of the NMOS transistor MN1 in the bias unit 10 so that the bias unit 10 generates a DC current to be used in the OP amplification unit 20 according to the bias control voltage level. The DC current generated by the bias unit 10 determines a current to be applied to the PMOS transistors MP3 and MP4, which constitute a differential amplifier.

As the charge pump (not shown) applies the control voltage VCTRL to a gate of the PMOS transistor MP3, the OP amplification unit 20 generates an N-bias voltage proportional to the control voltage VCTRL and outputs the N-bias voltage to the output unit 30.

The output unit 30 outputs the N-bias voltage VNCTRL generated by the OP amplification unit 20 to an outside of the N-bias generation circuit through the output terminal. The N-bias voltage is supplied to every NMOS transistor requiring the N-bias voltage in a PLL system.

The output voltage of the OP amplification unit 20 is applied to the gate of the NMOS transistor MN7 to determine a turn-on characteristic of the NMOS transistor MN7. The feedback voltage to the OP amplification unit 20 is determined depending on the turn-on characteristic of the NMOS transistor MN7. That is, the control voltage VCTRL generated by the charge pump is applied to the gate of the PMOS transistor MP5 to transfer the supply voltage through the PMOS transistor MP5. Here, the current amount is controlled by the turn-on characteristic of the NMOS transistor MN7.

In the conventional bias voltage generation circuit, a resistance REFF of the output terminal in the OP amplification unit 20 and a capacitor (load) connected to the output terminal of the output unit 30 create a pole. The pole location corresponds to a bandwidth of the bias voltage generation circuit.

However, since the PLL system uses a bias voltage generated in its bias voltage generation circuit as described above, the pole may decrease a phase margin of the PLL system.

FIG. 2 is a graph illustrating an open loop gain and a phase margin of a PLL system with an N-bias pole and those of the PLL system without the N-bias pole. Referring to FIG. 2, a zero created by a P-bias voltage generation circuit of the PLL system gradually increases a phase margin, however, a pole of the N-bias voltage generation circuit decreases the phase margin.

Consequently, because of the pole of the N-bias voltage generation circuit, the PLL system may not have a sufficient phase margin. This may decrease the stability of the PLL system, and may cause a jitter peaking due to an input clock noise and a power noise, thereby deteriorating a jitter characteristic.

SUMMARY OF THE INVENTION

Embodiments of the present invention are directed to providing a bias voltage generation circuit that can control a bandwidth.

Embodiments of the present invention are also directed to providing a bias voltage generation circuit that can control a bandwidth according to a bandwidth control of the PLL system.

Embodiments of the present invention are also directed to providing a phase locked loop including a bias voltage generation circuit that can control a bandwidth to generate its own bias voltage.

In accordance with an aspect of the present invention, there is provided a bias unit configured to control a current in response to a bandwidth control signal, an amplification unit configured to differentially amplify an input signal in response to the current controlled by the bias unit and an output unit configured to receive an output signal of the amplification unit to output the bias voltage

DESCRIPTION OF SPECIFIC EMBODIMENTS

Hereinafter, a bias voltage generation circuit and a phase locked loop in accordance with the present invention will be described in detail with reference to the accompanying drawings.

Figure 1:
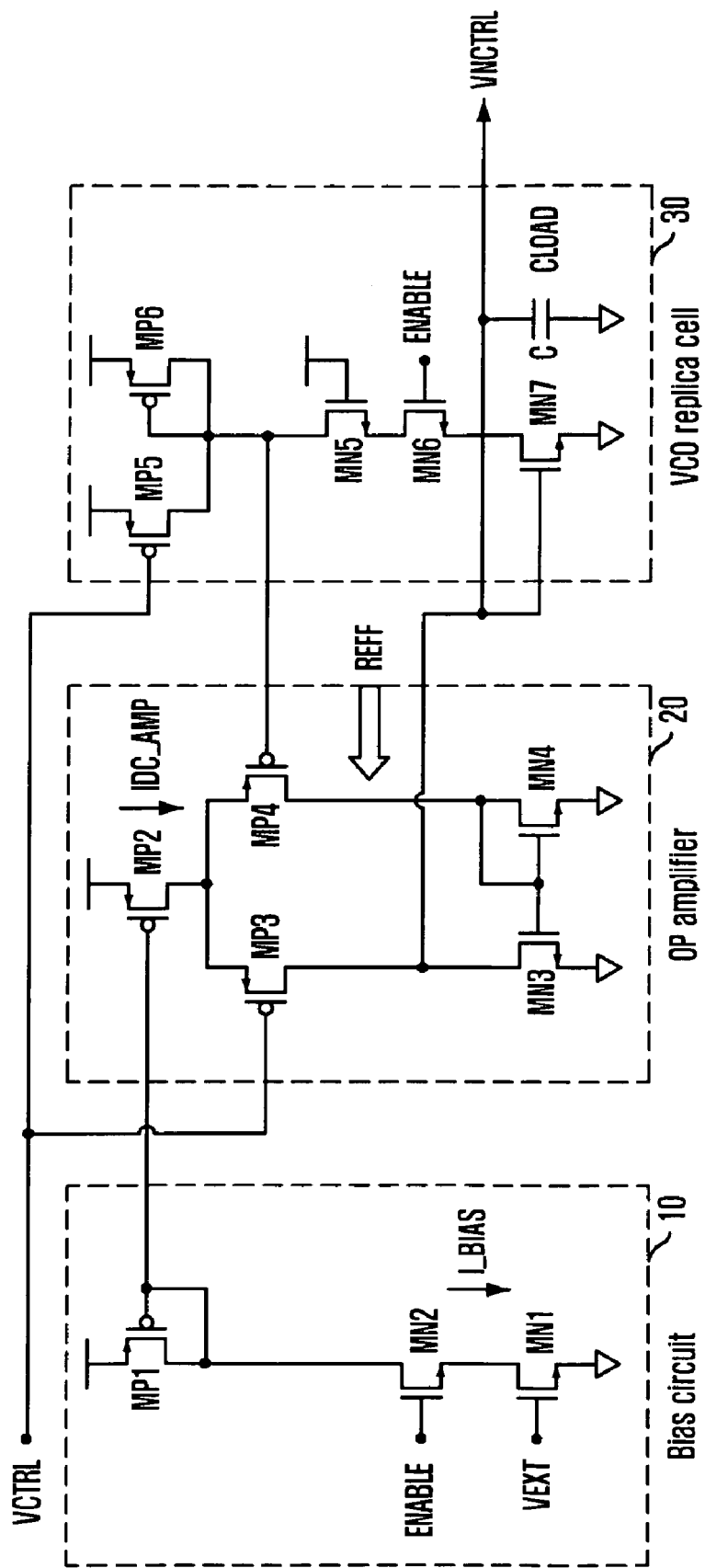
FIG. 1 is a circuit diagram of a conventional bias voltage generation circuit.
Figure 2:
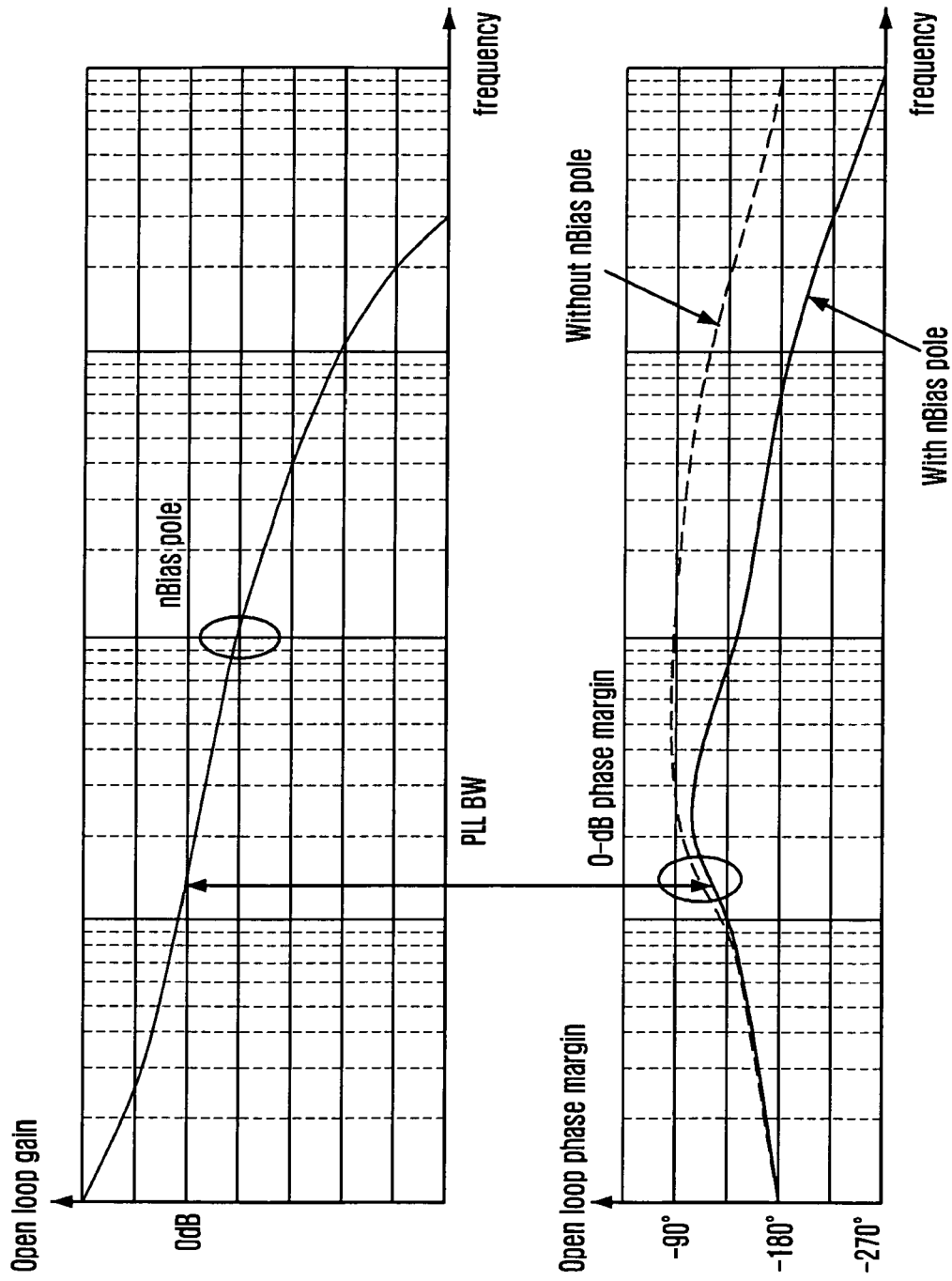
FIG. 2 is a graph illustrating an open loop gain and a phase margin of a PLL system with an N-bias pole and those of the PLL system without the N-bias pole.
Figure 3:
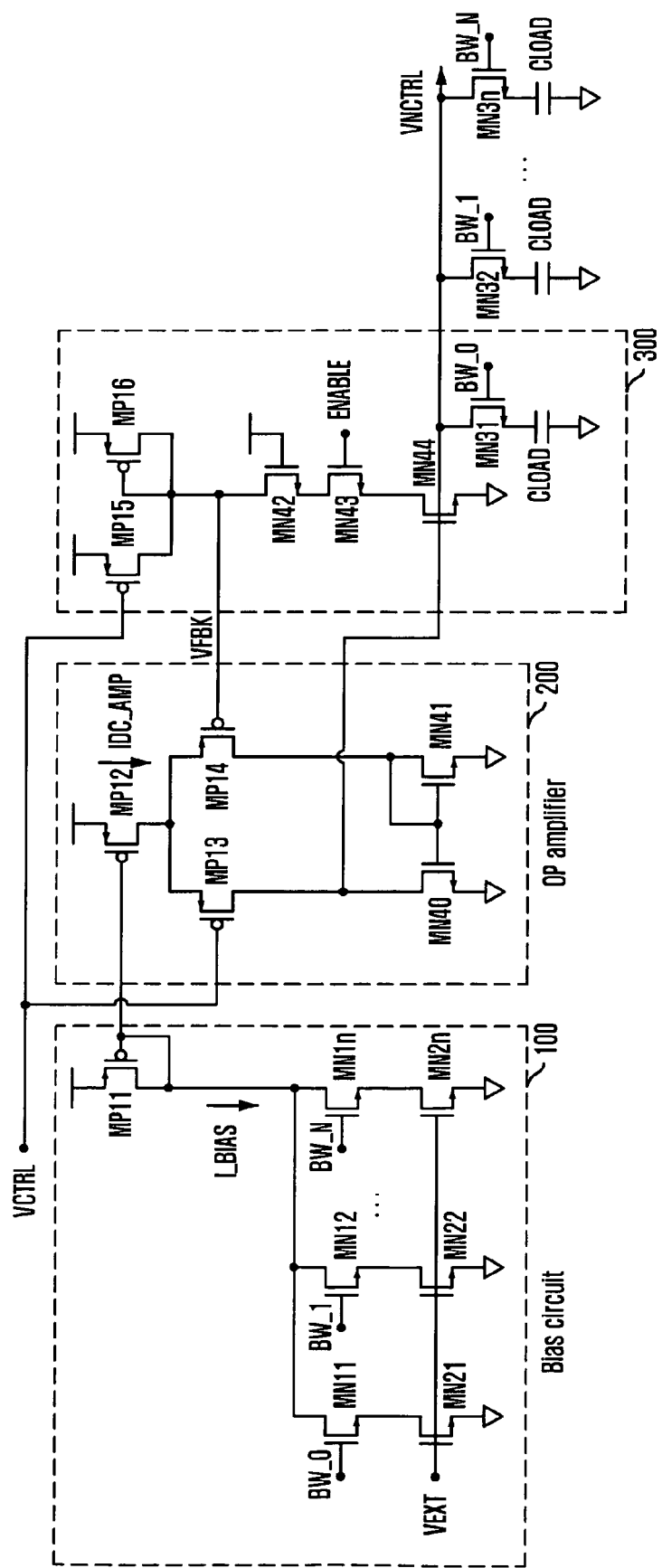
FIG. 3 is a circuit diagram of a bias voltage generation circuit in accordance with an embodiment of the present invention.

FIG. 3 is a circuit diagram of a bias voltage generation circuit in accordance with an embodiment of the present invention. Referring to FIG. 3, the bias voltage generation circuit includes a bias unit 100, an OP amplification unit 200 and an output unit 300.

The bias unit 100 receives a bias control voltage to generate a DC current for the OP amplification unit 200. The bias unit 100 may control an operation current of the OP amplification unit 200 according to the bias control voltage.

The OP amplification unit 200 differentially amplifies a control voltage VCTRL received from a charge pump (not shown). The OP amplification unit 200 may differentially amplify the control voltage VCTRL according to the current amount controlled by the bias unit 100. That is, the OP amplification unit 200 can control a bandwidth of the bias generation circuit according to the controlled current amount.

The output unit 300 may be an N-bias voltage output unit including a capacitor CLOAD for adjusting phase margins of the OP amplification unit 200 and a replica cell (not shown) of VCO. A bandwidth of the bias voltage generation circuit can be controlled by a capacitance of the capacitor CLOAD. To this end, the output unit 300 includes a circuit for controlling a capacitance of a load (capacitor) of the output terminal.

The bias unit 100 includes a PMOS transistor MP11 connected between a supply voltage and a ground voltage. The bias unit 100 further includes a current source having two NMOS transistors connected in series between the PMOS transistor MP11 and the ground voltage. The current source serves to control a current of the bias unit 100. The PMOS transistor MP11 has a source connected to the supply voltage VDD, and a drain and a gate connected to a common node.

The bias unit 100 may include a plurality of current sources each having two NMOS transistors and connected to the drain of the PMOS transistor MP11. The gates of first NMOS transistors MN11, MN12, . . . , MN1n constituting the current sources receive control signals BW_0, BW_1 . . . , BW_N from a test mode register set (TMRS) (not shown), respectively. The control signals are input from the TMRS to control a bandwidth according to a program stored before the PLL control. Accordingly, the different first NMOS transistors have different characteristic values.

The gates of second NMOS transistors MN21, MN22, . . . , MN2n receive a bias control voltage VEXT from a bias generation circuit (not shown).

The OP amplification unit 200 differentially amplifies the control voltage VCTRL in response to the DC current controlled by the bias unit 100. To this end, the OP amplification unit 200 includes PMOS transistors MP12, MP13 and MP14, and NMOS transistors MN40 and MN41.

The PMOS transistor 12 has a source connected to a supply voltage, a gate connected to a gate of the PMOS transistor MP11, and a drain connected to the transistors MP13 and MP14.

The PMOS transistor MP13 has a source connected to the drain of the PMOS transistor MP12, a gate configured to receive the control voltage VCTRL from the charge pump (not shown), and a drain connected to a drain of the NMOS transistor MN40. The NMOS transistor MN40 has a drain connected to the drain of the PMOS transistor MP13, a source connected to a ground voltage. The PMOS transistor MP14 has a source connected to the drain of the PMOS transistor MP12, a gate connected to a feedback line VFBK of the output unit 300, and a drain connected to the drain of the NMOS transistor MN41. The NMOS transistor MN41 has a source connected to a ground voltage, and a drain and a gate connected to a common node. Gates of the NMOS transistors MN40 and MN41 are connected to each other. A node connecting the drain of the PMOS transistor MP13 and the drain of the NMOS transistor MN40 is connected to an N-bias output terminal of the output unit 300.

The output unit 300 includes a capacitor CLOAD connected to the output terminal outputting a voltage differentially amplified by the OP amplification unit 200 to adjust phase margins of the OP amplification unit 200 and a VCO replica cell (not shown). The output unit 300 may also include a plurality of capacitors CLOAD having different capacitances from each other and connected in parallel between the output terminal and a ground voltage. A plurality of transistors MN31, MN32, . . . , MN3n are connected between the output terminal and the respective capacitors. The transistors MN31, MN32, . . . , MN3n operate in response to respective control signals BW_0, BW_1 , BW_N to operate the corresponding capacitors CLOAD. Although the control signals BW_0, BW_1, . . . , BW_N of the output unit 300 are described to be identical to the control signals BW_0, BW_1, . . . , BW_N of the bias unit 100, the present invention is not limited thereto. Instead, the control signals BW_0, BW_1, . . . BW_N of the output unit 300 and the control signals BW_0, BW_1 , BW_N of the bias unit 100 may be different signals from each other. In other words, it is possible to control only the current of the bias unit 100, only the capacitance of the capacitor of the output unit 300, or both the current of the bias unit 100 and the capacitance of the capacitor of the output unit 300, according to a bandwidth to control.

The output unit 300 further includes a circuit for controlling the feedback signal according to the output of the OP amplification unit 200. The circuit for controlling the feedback signal includes PMOS transistors MP15 and MP16, and NMOS transistors MN42, MN43 and MN44. The PMOS transistor MP15 has a source connected to a supply voltage, a gate configured to receive the control voltage VCTRL from the charge pump (not shown), and a drain connected to a common node connecting a drain and a gate of the PMOS transistor MP16. The PMOS transistor MP16 has a source connected to a supply voltage. The common node is connected to the gate of the PMOS transistor MP14 of the OP amplification unit 200 to form a feedback path from the output unit 300 to the OP amplification unit 200.

The NMOS transistors MN42, MN43 and MN44 are connected in series between the common node and a ground voltage. The NMOS transistor MN42 has a drain connected to the common node, a gate connected to a supply voltage, and a source connected to a drain of the NMOS transistor MN43. The NMOS transistor MN43 has a drain connected to the source of the NMOS transistor MN42, a gate configured to receive an enable signal, and a source connected to a drain of the NMOS transistor MN44. The NMOS transistor MN44 has a drain connected to the source of the NMOS transistor MN43, a gate configured to receive the output voltage of the OP amplification unit 200, and a source connected to the ground voltage. As the NMOS transistor MN42 receives the supply voltage as a gate voltage, the NMOS transistor MN42 turns on when a power is supplied to the bias generation circuit. As the NMOS transistor MN43 receives the enable signal as a gate voltage, the NMOS transistor MN43 turns on when the bias generation circuit operates. However, since the NMOS transistor MN44 receives the output voltage of the OP amplification unit 200, the NMOS transistor MN44 is affected by the output voltage of the OP amplification unit 200.

A method for generating the N-bias voltage by the bias voltage generation circuit having the above-described configuration will be described below.

Since an operation of the bias voltage generation circuit requires the supply voltage, the ground voltage and the enable signal, corresponding devices will be assumed to operate normally.

When the TMRS applies control signals BW_0, BW_1, . . . , BW_N to the bias voltage generation circuit, one of the current sources of the bias unit 100 operates. For example, when only the control signal BW_0 has a logic high level, and the other control signals BW_1, BW_2, . . . , BW_N all have a logic low level, only the NMOS transistor MN11 turns on, and the other NMOS transistors MN12, MN13, . . . , MN1n turn off, which are connected to the NMOS transistor MN11 in parallel.

Here, the NMOS transistors MN21, MN22, . . . , MN2n all turn on in response to the bias control voltage VEXT. However, since only the NMOS transistor MN11 turns on in response to the control signals BW_0, BW_1 . . . , BW_N, only the NMOS transistor MN21 operates normally, which is connected to the NMOS transistor MN11 in series. Therefore, the current source of the bias unit 100 is formed by the NMOS transistors MN11 and MN21.

As the current of the bias unit 100 is controlled as described above, the operation current of the OP amplification unit 200 is determined by the current. Obviously, when the current of the bias unit 100 is formed by the NMOS transistors MN12 and MN22, the operation current of the OP amplification unit 200 is different from the former. Therefore, the current to be applied to the PMOS transistors MP13 and MP14, which constitute the differential amplification unit, is determined by the DC current controlled by the bias unit 100.

When the charge pump (not shown) applies the control voltage VCTRL to the gate of the PMOS transistor MP13 in the OP amplification unit 200, an N-bias voltage proportional to the input control voltage is generated and output to the output unit 300. The output unit 300 outputs the N-bias voltage VNCTRL generated by the OP amplification unit 200 to the outside of the bias generation circuit through the output terminal. The output N-bias voltage is supplied to every NMOS transistor requiring the N-bias voltage in the PLL system.

The output voltage of the OP amplification unit 200 is applied to the gate of the NMOS transistor MN44 to determine the turn-on characteristic of the NMOS transistor MN44, thereby determining the feedback signal to the OP amplification unit 200. That is, the control voltage VCTRL is applied to the gate of the PMOS transistor MP15 so that a supply voltage is transferred through the PMOS transistor MP15. Here, the amount of transferred voltage is controlled by the turn-on characteristic of the NMOS transistor MN44.

Meanwhile, the capacitors connected to the output terminal of the output unit 300 are also used to control the bandwidth of the bias generation circuit. That is, when one transistor MN31 turns on in response to the control signals BW_0, BW_1, ..., BW_N, a current path is formed through the transistor MN31 to the capacitor and to the ground voltage. Accordingly, the bias voltage generated by the OP amplification unit 200 is output through charge/discharge of the operating capacitor.

Although the control signals BW_0, BW_1, ..., BW_N of the output unit 300 are described to be identical to the control signals BW_0, BW_1, ..., BW_N of the bias unit 100, the present invention is not limited thereto. Instead, the control signals BW_0, BW_1, ..., BW_N of the output unit 300 and the control signals BW_0, BW_1, ..., BW_N of the bias unit 100 may be different signals from each other. In other words, it is possible to control only the current of the bias unit 100, only the capacitance of the capacitor of the output unit 300, or both the current of the bias unit 100 and the capacitance of the capacitor of the output unit 300, according to a bandwidth to control.

As described above, the bias generation circuit in accordance with the embodiment can control a bandwidth, and thus can be used in a variety of circuits.

Figure 4:
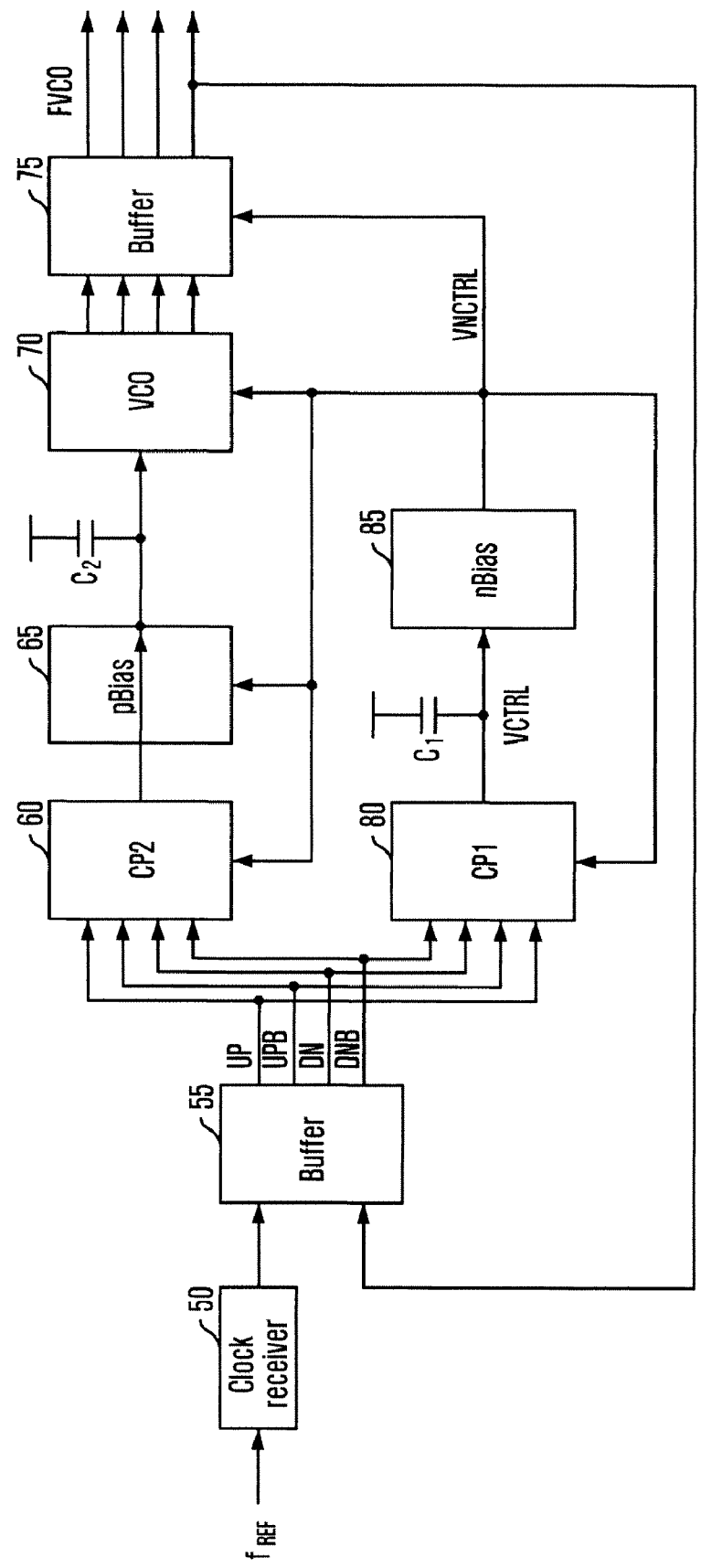
FIG. 4 is a block diagram of a phase locked loop in accordance with an embodiment of the present invention.

FIG. 4 is a block diagram of a phase locked loop in accordance with an embodiment of the present invention.

The phase locked loop (PLL) includes a phase/frequency detector (PFD) 55, a charge pump 60, and a voltage-controlled oscillator (VCO) 70 to control a frequency of an input clock signal. The phase/frequency detector 55 detects a phase difference between an input clock input to the PLL system and a return clock generated by a return loop, and outputs an up signal UP or a down signal DN according to the detected phase difference. The charge pump 60 outputs current proportional to the up and down signals UP and DN. The voltage-controlled oscillator 70 outputs a frequency corresponding to a voltage received from a P-bias generation circuit 65, a resistive element. The phase locked loop further includes other typical elements of a PLL system.

Here, the return loop refers to a path from the phase/frequency detector 55, to the charge pump 60, to the P-bias generation circuit 65, to the voltage-controlled oscillator 70, to a buffer, and then back to the phase/frequency detector 55. The P-bias generation circuit 65, although a detailed description thereof is omitted herein, serves as a resistor between the charge pump 60 and the voltage-controlled oscillator 70. The P-bias generation circuit 65 also serves to generate a P-bias voltage required by the voltage-controlled oscillator 70 and outputs it to the voltage-controlled oscillator 70.

The phase locked loop further includes a circuit for generating an N-bias voltage to be used in the PLL system, using the clock signal generated by the phase/frequency detector 55.

The circuit for generating the N-bias voltage includes a charge pump 80 and an N-bias voltage generation circuit 85. The charge pump 80 outputs a current proportional to the clock signal received from the phase/frequency detector 55. The N-bias voltage generation circuit 85 receives an output signal of the charge pump 80 to generate an N-bias voltage. The N-bias voltage generated by the N-bias voltage generation circuit 85 is used as an N-bias voltage for operating NMOS transistors in the PLL system. Accordingly, the N-bias voltage is supplied to the charge pumps 60 and 80, the P-bias generation circuit 65, the voltage-controlled oscillator 70 and the buffer 75.

The N-bias voltage generation circuit 85 has a configuration capable of controlling a bandwidth, as shown in FIG. 3.

The N-bias voltage generation circuit 85 controls the bandwidth by controlling a current source in the bias unit 100 to control a current output to the OP amplification unit 200, or changing capacitance of the capacitor in the output unit 300. Here, the bandwidth of the N-bias voltage generation circuit 85 is controlled to vary with the bandwidth of the PLL system. In other words, the bandwidth of the N-bias voltage generation circuit 85 is controlled to be changed when the bandwidth of the PLL system is changed by a controller (not shown). The reference numeral "50" indicates a clock receiver 50 configured to generate a clock signal according to a reference frequency to provide the PLL system with a clock signal. The reference numeral "75" indicates a buffer configured to temporarily buffer the signal generated by the voltage-controlled oscillator 70 and the N-bias generation circuit.

Operation of the phase locked loop having the above-described configurations will be described below.

In general, the bandwidth variation in the PLL system is performed by varying a bandwidth of the charge pump. Therefore, the case of varying the bandwidth of the charge pumps 60 and 80 will be described herein.

When a test mode resister set (TMRS; not shown) controls the bandwidth variation in the PLL system, the N-bias voltage generation circuit 85 simultaneously receives a control signal for the bandwidth variation.

According to the received bandwidth control signal, the bias unit 100 controls a current to control a current of the OP amplification unit 200. Then, the bandwidth of the N-bias voltage generation circuit 85 is controlled by the controlled current.

If the bandwidth control signal is applied to the output unit 300 instead of the bias unit 100, the current of the bias unit 100 and the current of the OP amplification unit 200 are not controlled. Instead, the capacitance of the capacitor in the output unit 300 is controlled to control the bandwidth of the bias voltage generation circuit 85.

In the case where the bandwidth control signal is simultaneously applied to the bias unit 100 and the output unit 300, both the current and the capacitance of the capacitor are controlled to control the bandwidth of the bias voltage generation circuit 85.

The N-bias voltage on which the bandwidth control is performed as described above is supplied to every NMOS transistor in the PLL system, which requires the N-bias voltage.

The above-described embodiment is merely illustrative, and can be applied to variably controlling a bandwidth of an N-bias voltage generation circuit. Specifically, the N-bias voltage generation circuit is a circuit generating N-bias voltage in the PLL system.

While the present invention has been described with respect to the specific embodiments, it will be apparent to those skilled in the art that various changes and modifications may be made without departing from the spirit and scope of the invention as defined in the following claims.

What is claimed is:

1. A bias voltage generation circuit for generating a bias voltage for a clock synchronizing circuit, the bias voltage generation circuit comprising:
   a bias unit configured to control a current in response to a plurality of first bandwidth control signals;
   an amplification unit configured to differentially amplify an input signal in response to the current controlled by the bias unit; and
   an output unit configured to receive an output signal of the amplification unit to variably control the bias voltage in response to a plurality of second bandwidth control signals and output the bias voltage,
wherein the bias unit, comprising
a plurality of first transistors configured to operate in response to the first bandwidth control signals from a mode register set; and
a plurality of second transistors coupled to the first transistors in series and configured to operate in response to a bias control voltage,
wherein the output unit comprises a feedback path configured to detect an output of the amplification unit to control a feedback voltage depending on the detected output of the amplification unit,
wherein the output unit is configured to control a capacitance of a capacitor connected to an output node to variably control the bias voltage.

2. The bias voltage generation circuit as recited in claim 1, wherein the plurality of current sources connected between a supply voltage and a ground voltage, the current sources having different characteristic values and selectively operating in response to the first bandwidth control signals.

3. The bias voltage generation circuit as recited in claim 2, wherein each of the current sources comprises at least two NMOS transistors.

4. The bias voltage generation circuit as recited in claim 1, wherein the bias voltage is an NMOS transistor control voltage.

5. A bias voltage generation circuit for generating a bias voltage for a clock synchronizing circuit, the bias voltage generation circuit comprising:
a bias unit configured to generate an operation current in response to a plurality of first bandwidth control signals;
an amplification unit configured to differentially amplify an input signal in response to the operation current; and
an output unit configured to receive an output signal of the amplification unit to variably control the bias voltage in response to a plurality of second bandwidth control signals,
wherein the bias unit, comprising:
a plurality of first transistors configured to operate in response to the first bandwidth control signals from a mode register set; and
a plurality of second transistors coupled to the first transistors in series and configured to operate in response to a bias control voltage,
wherein the output unit comprises a feedback path configured to detect an output of the amplification unit to control a feedback voltage depending on the detected output of the amplification unit,
wherein the output unit is configured to control a capacitance of a capacitor connected to an output node to variably control the bias voltage.

6. The bias voltage generation circuit as recited in claim 5, wherein the output unit comprises:
a plurality of capacitors of different capacitances connected between the output node and a ground voltage; and
a plurality of switches configured to control an operation of each of the capacitors,
wherein the switches are controlled by the second bandwidth control signals.

7. A clock synchronizing circuit, comprising:
a phase/frequency detector configured to detect a phase difference between an input clock and a return clock to output an up signal or a down signal according to the phase difference;
a first charge pump configured to output a current proportional to the up and down signals;
a voltage-controlled oscillator configured to vary a frequency according to the current received from the first charge pump; and
a bias voltage generator configured to variably control a bandwidth to generate a bias voltage according to the up and down signals generated by the phase/frequency detector,
wherein the bias voltage generated by the bias generator is applied to the voltage-controlled oscillator,
wherein the bias voltage generator comprises a bias unit, comprising:
a plurality of first transistors configured to operate in response to a plurality of first bandwidth control signals from a mode register set; and
a plurality of second transistor coupled to the first transistor in series and configured to operate in response to a bias control voltage,
wherein the bias voltage generator further comprises:
an amplification unit configured to differentially amplify an input signal in response to an operation current; and
an output unit configured to receive an output signal of the amplification unit to variably control the bias voltage in response a plurality of second bandwidth control signals,
wherein the output unit comprises a feedback path configured to detect an output of the amplification unit to control a feedback voltage depending on the detected output of the amplification unit,
wherein the output unit is configured to control a capacitance of a capacitor connected to an output node to variably control the bias voltage.

8. The clock synchronizing circuit as recited in claim 7, wherein the bias voltage generator comprises:
a second charge pump configured to generate a current proportional to the up and down signals; and
a bias voltage generation unit configured to variably control the bandwidth to generate the bias voltage according to the current received from the second charge pump.

9. The clock synchronizing circuit as recited in claim 8, wherein the bias voltage generation unit comprises:
the bias unit configured to control the operation current in response to the bandwidth control signal.

10. The clock synchronizing circuit as recited in claim 8, wherein the bias voltage generation circuit comprises:
the bias unit configured to generate the operation current.

11. The clock synchronizing circuit as recited in claim 7, wherein the plurality of current sources that have different characteristic values and are connected between a supply voltage and a ground voltage to control an operation current of the amplification unit according to the second bandwidth control signals.

12. The clock synchronizing circuit as recited in claim 7, further comprising a buffer configured to buffer an output of the voltage-controlled oscillator, wherein the bias voltage generated by the bias generation circuit is applied to the first charge pump and the buffer.

* * * * *